(12) United States Patent
Kelekar et al.

(10) Patent No.: US 8,617,409 B2
(45) Date of Patent: Dec. 31, 2013

(54) MAGNETICALLY LEVITATED GAS CELL FOR TOUCHLESS SITE-ISOLATED WET PROCESSING

(75) Inventors: Rajesh Kelekar, Los Altos, CA (US); Kent Riley Child, Dublin, CA (US)

(73) Assignee: Intermolecular, Inc., San Jose, CA (US)

( * ) Notice: Subject to any disclaimer, the term of this patent is extended or adjusted under 35 U.S.C. 154(b) by 210 days.

(21) Appl. No.: 13/302,178

(22) Filed: Nov. 22, 2011

(65) Prior Publication Data

US 2013/0126477 A1 May 23, 2013

(51) Int. Cl.
*H01L 21/302* (2006.01)
*B08B 3/04* (2006.01)
*C23F 1/02* (2006.01)

(52) U.S. Cl.
USPC .................. 216/41; 216/45; 216/83; 216/84; 438/689; 438/745; 134/2; 134/21; 134/26; 134/27; 134/902; 134/84; 134/88; 134/117; 134/137; 156/345.15; 156/345.19; 118/720; 118/721; 506/33; 73/865.9; 269/20; 335/285

(58) Field of Classification Search
None
See application file for complete search history.

(56) References Cited

U.S. PATENT DOCUMENTS

| | | | |
|---|---|---|---|
| 4,085,037 A | 4/1978 | Quets et al. | |
| 4,477,287 A | 10/1984 | Kush et al. | |
| 4,953,389 A | 9/1990 | Schurch | |
| 6,142,017 A | 11/2000 | Glassey | |
| 6,357,907 B1 | 3/2002 | Cleveland et al. | |
| 6,601,888 B2 | 8/2003 | Mcilwraith et al. | |
| 6,764,386 B2 | 7/2004 | Uziel | |
| 7,098,045 B2 | 8/2006 | Noji et al. | |
| 7,456,930 B2 | 11/2008 | Hazelton et al. | |
| 7,472,786 B2 | 1/2009 | Komori | |
| 7,908,885 B2 | 3/2011 | Devitt | |
| 8,490,634 B2 * | 7/2013 | Obweger et al. | 134/157 |
| 2008/0311758 A1 * | 12/2008 | Bailey et al. | 438/732 |
| 2010/0300492 A1 | 12/2010 | Magni et al. | |
| 2011/0209663 A1 * | 9/2011 | Endo et al. | 118/719 |
| 2013/0160858 A1 * | 6/2013 | Francis | 137/1 |

FOREIGN PATENT DOCUMENTS

WO 2008121561 A1 10/2008

* cited by examiner

*Primary Examiner* — Anita Alanko

(57) ABSTRACT

A protective chuck is magnetically levitated on a substrate with a gas layer between the bottom surface of the protective chuck and the substrate surface. The gas layer protects a surface region of the substrate against a fluid layer covering the remaining of the substrate surface without contacting the substrate, reducing or eliminating potential damage to the substrate surface. The magnetically levitated protective chuck can enable combinatorial processing of a substrate, providing multiple isolated processing regions on a single substrate with different material and processing conditions.

20 Claims, 20 Drawing Sheets

Lowering the protective chuck onto the substrate, wherein a bottom surface of the protective chuck levitates above a surface region of the substrate by magnetic repulsion
1900

Controlling a magnetic repulsion between the protective chuck and the surface region of the substrate to achieve a separation distance between the bottom surface of the protective chuck and the surface region of the substrate
1910

Submerging the substrate in a fluid tank with the surface region protected by the gas layer of the protective chuck
1920

Adjusting a gas flow or a gas flow path conductance to achieve a gas pressure of the gas layer
1930

Measuring a gas pressure between the bottom of the protective chuck and the region surface;
Dynamically regulating the gas flow to achieve a gas pressure of the gas layer
1940

Regulating the gas layer to either generate gas bubbles flowing to the fluid outside the surface region or to generate fluid bubbles flowing toward the gas layer
1950

FIG. 19

MAGNETICALLY LEVITATED GAS CELL FOR TOUCHLESS SITE-ISOLATED WET PROCESSING

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, multiple site isolated regions on a substrate surface can be formed by sealing different regions of the surface, isolating the surface regions from each other. The surface sealing can generate particles, which requires subsequent substrate cleaning. Therefore there is a need for non-contact isolation of surface regions on a substrate surface.

SUMMARY OF THE DESCRIPTION

In some embodiments, the present invention discloses systems and methods for isolating a surface region of a substrate during a wet processing of the remaining surface without contacting the surface. The present invention forms a gas layer on a surface region of the substrate, protecting the surface region from being similarly processed by the fluid. In addition, magnetic repulsion can be used to stabilize the gas layer.

In some embodiments, the present invention discloses a protective chuck disposed on a surface region of a substrate with a gas layer in between. A magnetic repulsion between the protective chuck and a substrate support can form a gap between the protective chuck and the substrate surface, preventing the protective chuck from contacting the substrate. A gas layer is formed in the gap to form a barrier region, blocking an outside fluid.

In some embodiments, the present invention discloses methods for selectively processing a substrate, using a protective chuck configured for magnetically levitated above a substrate, together with forming a gas layer at the gap between the protective chuck and the substrate. After the substrate surface is covered with a processing fluid, the surface area under the protective chuck is excluded from being processed. The present selective processing methods can be used in high productivity combinatorial processes, achieving multiple isolated regions with different properties, which can be used for evaluating and optimizing materials and fabrication process conditions. For example, a large matrix screening can be performed through multiple isolated regions on a single wafer, providing a quick and cost effective way for new device and material developments.

In some embodiments, the present invention discloses a high productivity combinatorial system, comprising a substrate support configured to magnetically levitate a protective chuck above a substrate disposed on the substrate support.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 19 illustrates another exemplary flowchart for processing a substrate using a magnetically levitated protective chuck according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for isolating a surface region of a substrate, without contacting the surface, during a wet processing of the remaining surface. The present non-contact isolation can reduce or eliminate particulates or debris, especially at the boundary of the protected region. In some embodiments, the present invention discloses methods and systems for use in high productivity combinatorial processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
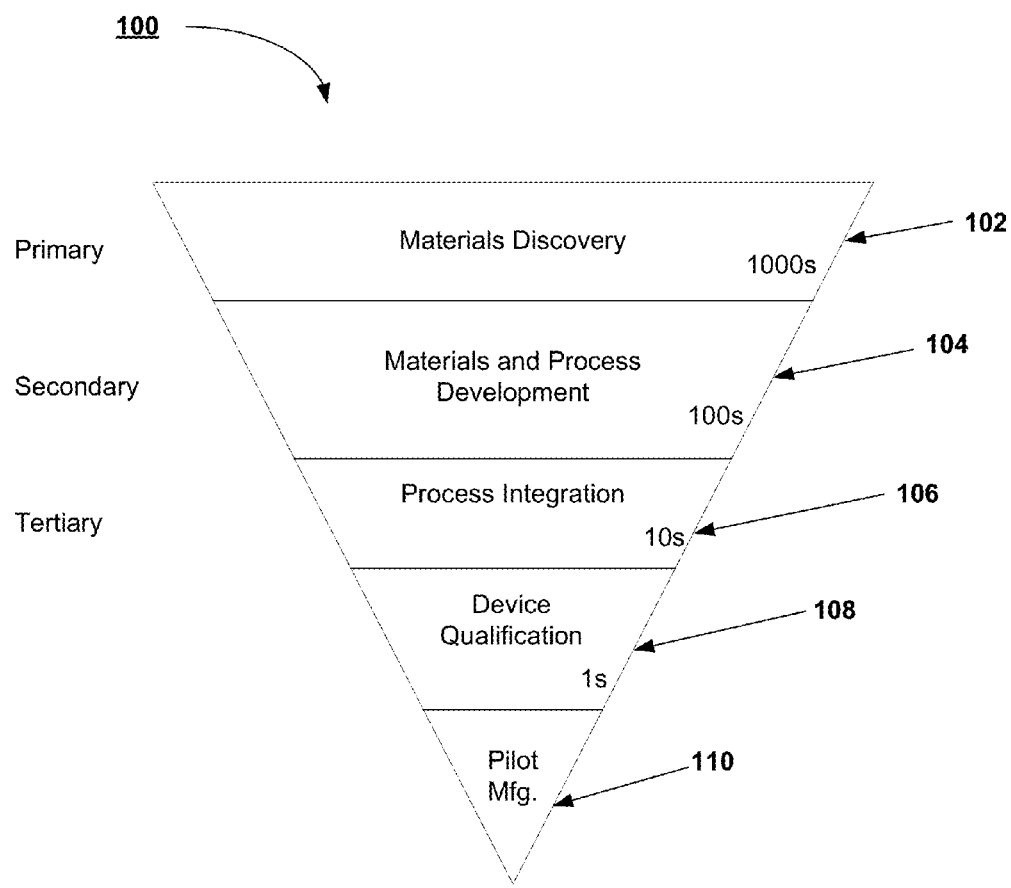
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
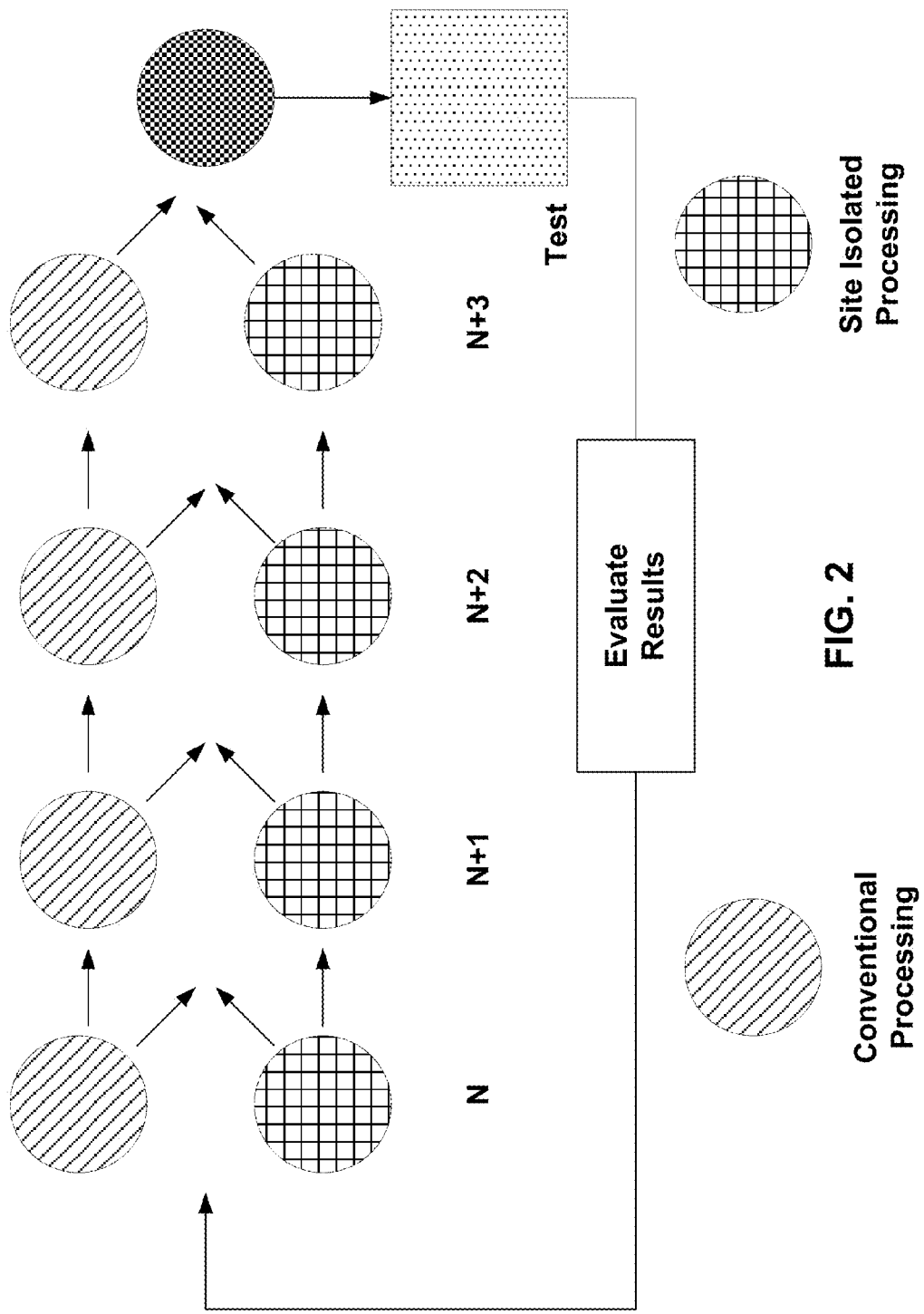
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
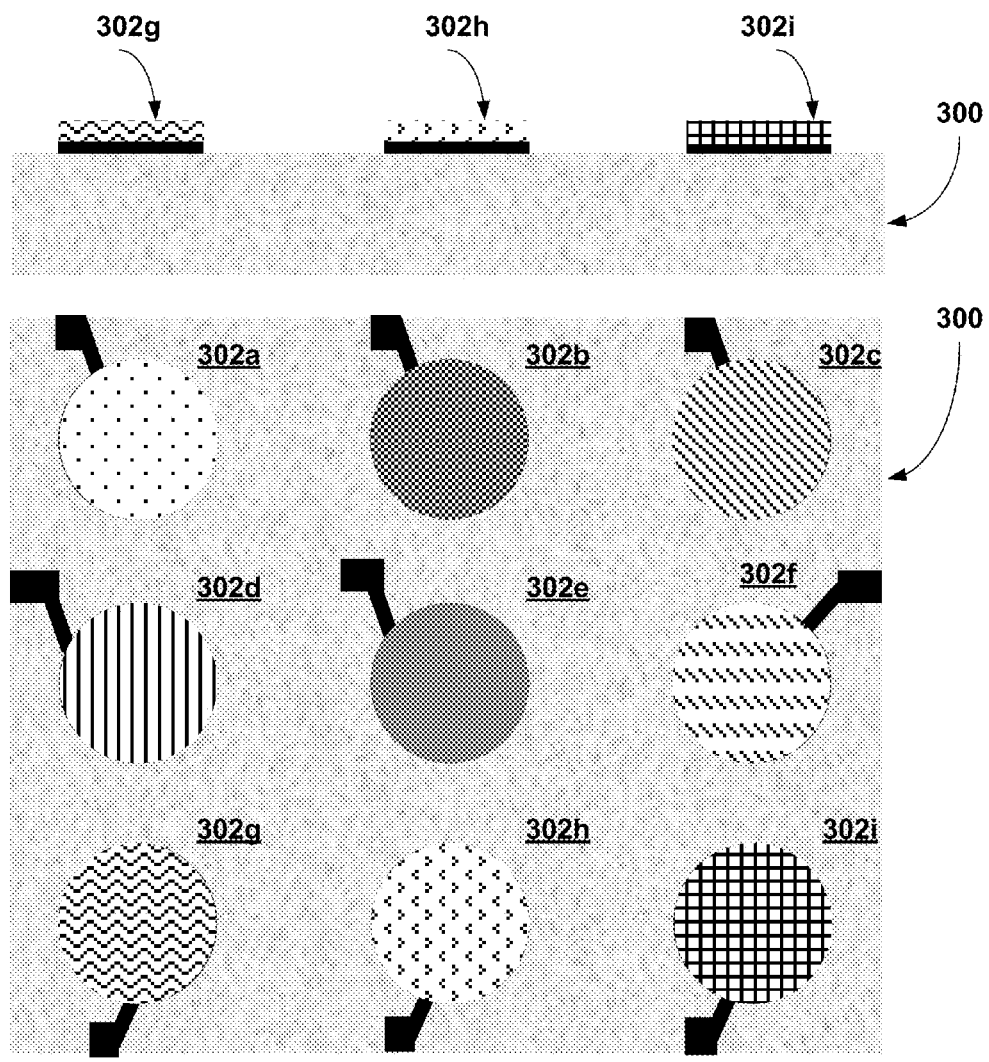
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302a-302i, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302g-302i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
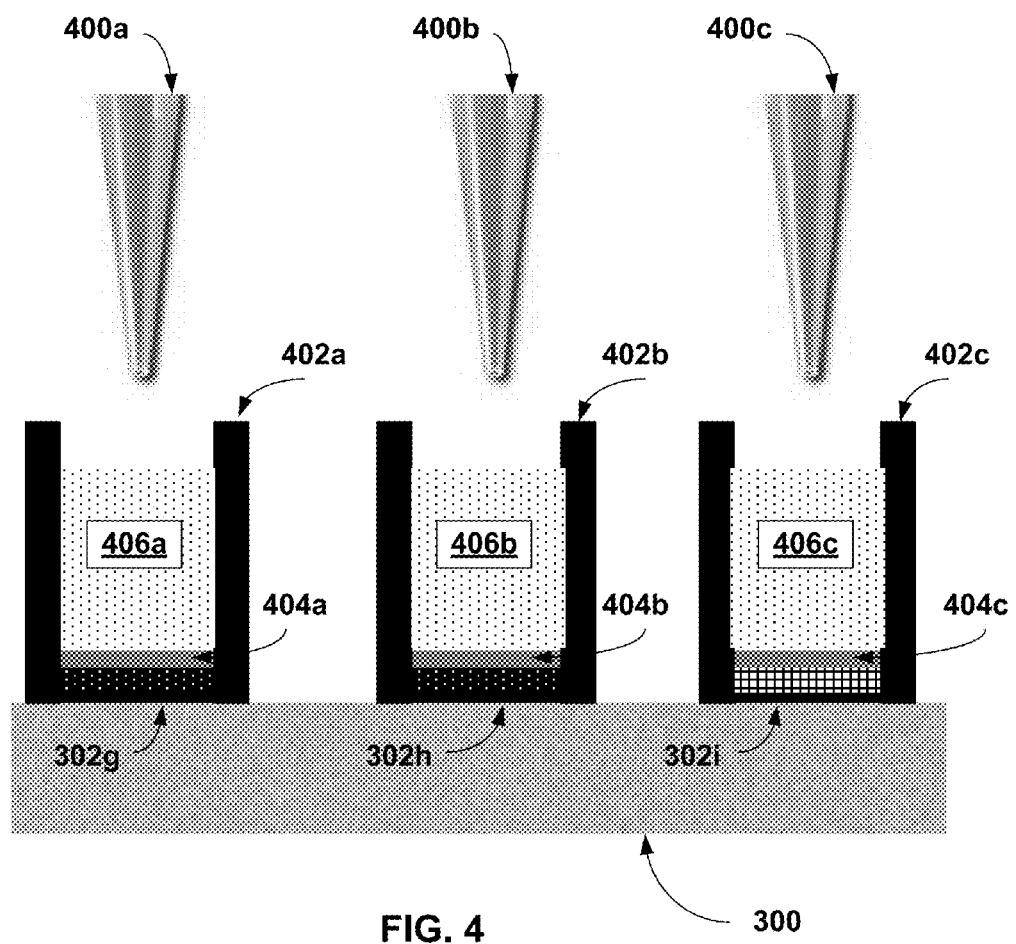
FIG. 4 illustrates a schematic diagram of a combinatorial wet processing system according to an embodiment described herein.

FIG. 4 illustrates a schematic diagram of a combinatorial wet processing system according to an embodiment described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302g-302i similar to the upper portion of FIG. 3. Solution dispensing nozzles, 400a-400c, supply different solution chemistries, 406a-406c, to chemical processing cells, 402a-402c. FIG. 4 illustrates the deposition of a layer, 404a-404c, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the site isolated regions are the areas of interest in a combinatorial process, since they provide the variations of process and material parameters, which can be evaluated to obtain the optimum device structures and fabrication processes. In some embodiments, the remaining surface of the substrate, e.g., the surface area outside the site isolated regions, is also processed, such as, to clean or etch the outside surface area. For example, to clean the remaining surface with a wet cleaning fluid, the isolated regions are protected and cleaning chemical is introduced to the remaining substrate surface.

In some embodiments, the present invention discloses methods for processing a substrate, comprising forming a surface region on the substrate that are protected from an outside fluid. The surface region on the substrate is formed without any physical contact with the substrate, preventing any generation of particulates or debris caused by contact friction.

In some embodiments, the substrate surface is covered with a fluid, for example, to clean or wet etch the substrate surface. The present non-contact protected surface regions can allow the exclusion of certain surface areas on the substrate from being similarly processed by the fluid without any potential damage caused by added particles.

In some embodiments, the present invention discloses a protective chuck magnetically levitated above a substrate with a gas layer in between. A magnetic repulsion force between the protective chuck and a substrate support can levitate the protective chuck above the substrate surface, preventing the protective chuck from contacting the substrate. The gas pressurizes the gap between the protective chuck and the substrate, forming a barrier region, blocking the outside fluid.

Figure 5A:
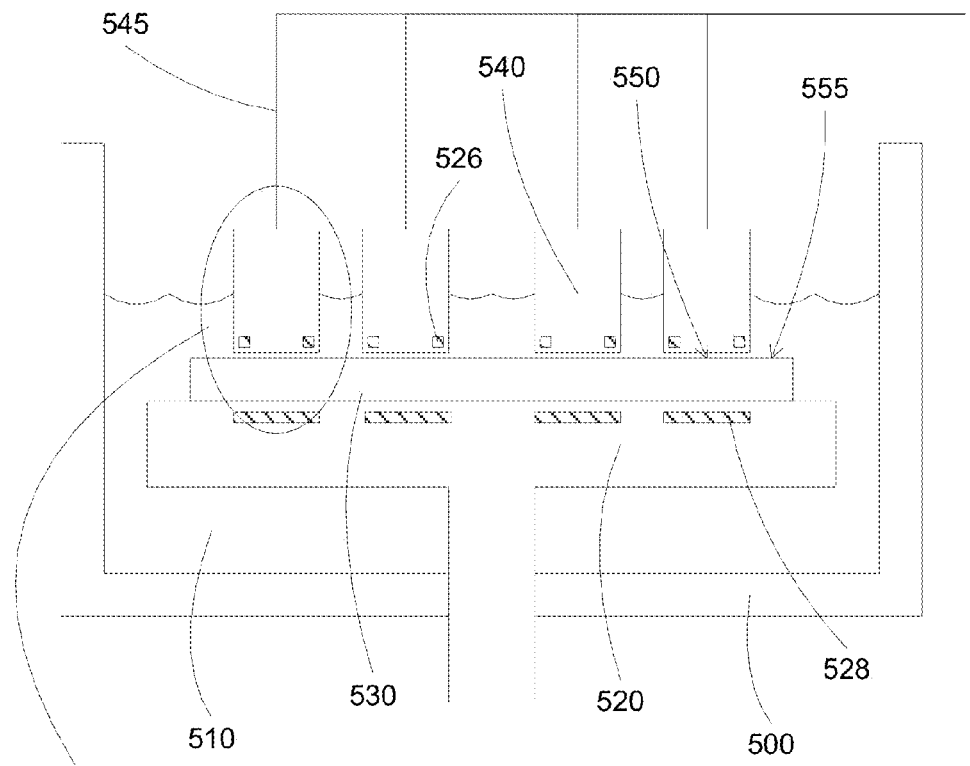
FIGS. 5A-5B illustrate an exemplary surface protection with magnetic levitation according to some embodiments of the present invention.
Figure 5B:
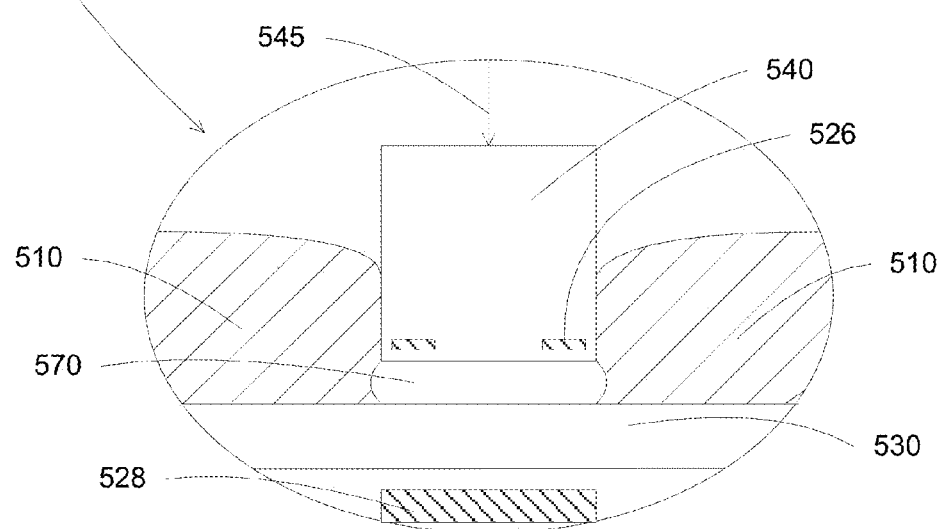

FIGS. 5A-5B illustrate an exemplary surface protection with magnetic levitation according to some embodiments of the present invention. In FIG. 5A, a process chamber 500 supports a substrate support 520 having a substrate 530 disposed thereon. The substrate 530 is submerged in a processing fluid 510, for example, a cleaning fluid, a rinsing fluid, or an etching fluid. The process chamber 500 can be a part of a HPC system, which comprises a plurality of protective chucks 540 protecting isolated regions 550 of the substrate. The protective chuck 540 further comprises magnetic elements 526 disposed at or near a bottom surface. The substrate support 520 can also comprise magnetic element 528, configured to generate a magnetic repulsion force between the protective chuck 540 and the substrate support 520. The magnetic repulsion force between magnetic elements 526 and 528 can levitate the protective chuck 540 above the substrate surface, forming an air gap between the protective chuck 540 above the substrate 530. Gas lines 545 can be supplied to the protective chucks 540, for example, to pressurize the air gap against the surrounding fluid 510. The remaining surface 555 of the substrate, outside the protected isolated regions 550, is processed by the processing fluid 510.

In the present description, the term "remaining surface of a substrate" is used to describe the substrate areas outside the site isolated regions. For example, a single reactor or protective chuck 540, when positioned on a substrate surface, defines a site isolated region 550. The substrate surface area outside of this site isolated region 550 is the remaining surface of the substrate. For multiple reactors or protective chucks (for example, 4 protective chucks are shown in FIG. 5A), the remaining surface of the substrate is the substrate surface outside of the multiple site isolated regions covered by the multiple reactors or protective chucks (the substrate surface 555 in FIG. 5A). In addition, the term "outside surface" sometimes can be used with similar meaning as the term "remaining surface", to indicate the area of the substrate surface outside the site isolated regions defined by the reactors or chucks.

FIG. 5B shows an exemplary configuration of a protective chuck 540 protecting surface 550 regions of the substrate 530 against the fluid processing 510. The protective chuck 540 is levitated above the substrate 530, due to a repulsion force between the magnetic elements 526 and 528. A gas layer 570 is formed under the protective chuck 540, for example, with supplied gas coming from gas inlet 545. The gas layer 570 forms a pressurized layer, preventing the fluid 510 from entering the surface region 550. The fluid 510 thus stays within the surface region 555, outside the region 550. The gas layer 570 provides a non-contact protection of the region 550, eliminating any particle or debris generation due to abrasive contacts.

In some embodiments, the protective chuck comprises a substantially flat bottom surface, e.g., the surface to be disposed in proximity with the substrate surface. The protective chuck also comprises a second surface covering the remaining surface of the protective chuck, including the side surface and the top surface. The substantially flat bottom surface can form a substantially uniform gap with the substrate, enabling a gas flow across the flat bottom surface to create a pressurized gas layer under the protective chuck.

Figure 6A:
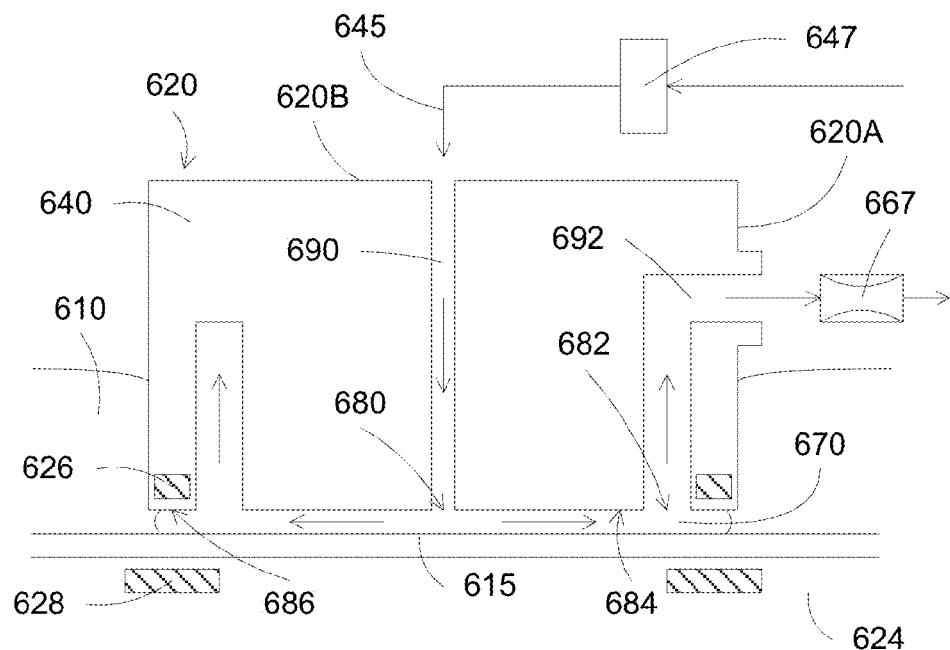
FIGS. 6A-6B illustrate an exemplary protective chuck according to some embodiments of the present invention.
Figure 6B:
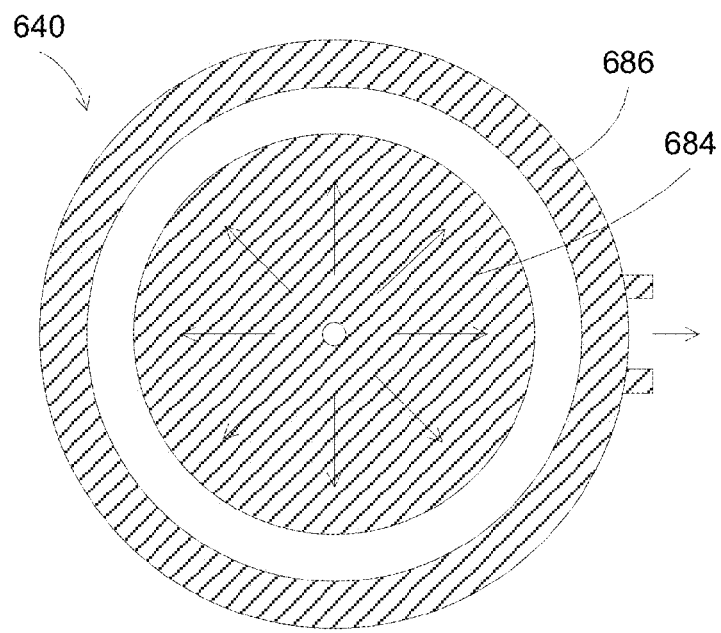

FIGS. 6A-6B illustrate an exemplary protective chuck according to some embodiments of the present invention. FIG. 6A shows a cross section side view and FIG. 6B shows a bottom view of the protective chuck 640. The protective chuck 640 comprises magnetic element 626 disposed at or near bottom surface 686. In response to corresponding magnetic elements 628, disposed in a substrate support 624, the magnetic elements 626 and 628 are configured to generate a magnetic repulsion force, which can levitate the protective chuck 640 above the substrate surface 615, forming an air gap 670.

The protective chuck 640 comprises a substantially flat bottom surface 684 and 686, to be disposed in close proximity with the substrate surface 615. The protective chuck also comprises a second surface 620, covering the rest of the chuck surface, for example, comprising a top surface 620B and a side surface 620A. The second surface can be used for gas connection, such as inlet and outlet ports for gas supply to form the gas layer.

In some embodiments, the bottom flat surface comprises two substantially flat areas: an outer substantially flat area 686 surrounding a peripheral of the bottom surface and an inner substantially flat area 684 surrounding an inner opening 680, such as a recessed area. The inner opening 680 is preferably disposed at a center of the bottom surface, but can be located anywhere within the inner substantially flat area 684. The area 682 between the outer flat area 686 and the inner flat area 684 is also preferably recessed, forming an outer recessed ring 682 surrounding the inner flat area. A gas flow 647 between the opening 680 and the recessed area 682 along the inner flat area 684 can establish a pressurized gas layer in the air gap 670, which can prevent the fluid 610 from entering the air gap 670.

The opening 680 and the recessed area 682 are coupled to first and second conduits 690 and 692, respectively, leading to the second surface 620, e.g., the outside surface of the protective chuck, to form an inlet and an outlet of a gas flow. For example, first conduit 690 connects the inner opening 680 with the top surface 620B of the chuck. Second conduit 692 connects the outer recessed area 682 with the side surface 620A of the chuck. Coupling can be provided at the end of the conduits at the outside surface for ease of connection to an external gas flow assembly. One conduit can serve as a gas inlet, and the other conduit served as a gas outlet. For example, the first conduit 690 can accept a gas input flow through a coupling to a gas source 645, preferably through a flow meter 649 to measure the gas flow, or a flow controller to control the gas flow. The second conduit 692 can be left open, forming a vent ring that releases the gas output flow to atmosphere. A restricting valve 667 can be coupled to the gas output flow, for example, externally to the protective chuck after the gas outlet, or internally within the second conduit, to regulate a flow resistance, or a flow conductance, of the gas flow, effectively affecting the gas pressure at the gas layer. For example, with a same gas flow at the first conduit inlet, a more restricted second conduit would increase the gas pressure at the gas layer, protecting the surface region under the protective chuck from the outside fluid.

In some embodiments, the outer and the inner substantially flat areas are formed from a one-piece component, which can improve the stability of the protective chuck. For example, the protective chuck can be formed of a one-piece component, with the opening 680 and the recess area 682 machined on the one-piece component to form the outer and the inner substantially flat areas 686 and 684.

In some embodiments, magnetic elements can be embedded in a protective chuck and in a substrate support to generate magnetic repulsion that can levitate the protective chuck above a substrate disposed on the substrate support. The magnetic elements preferably comprise an electromagnet, or a magnetic material, such as a permanent magnet, or a diamagnetic material. For example, two magnets (electromagnets or permanent magnets) disposed in parallel with similar pole sides facing each other (e.g., a north pole facing a north pole and a south pole facing a south pole) can form a magnetic repulsion force between them. Alternatively, diamagnetic material can repel magnetic field, and when used in conjunction with a magnets, can form magnetic repulsion force.

In some embodiments, the present invention discloses a protective chuck for protecting a surface region of a substrate, comprising a bottom surface and a remaining surface comprising side and top areas; a first gas conduit connecting the remaining surface with a first opening on the bottom surface; a second gas conduit connecting the second surface with a second opening on the bottom surface; and a magnetic material disposed in a vicinity of the bottom surface, wherein the magnetic material is configured to levitate the protective chuck above the surface region of the substrate by magnetic repulsion. The magnetic material can comprise a magnet or a diamagnetic material. The first opening comprises a recess area, and wherein the first gas conduit comprises a plurality of gas inlets disposed in a peripheral of the recessed area. The second opening comprises a recessed ring surrounding a peripheral of the bottom surface. In addition, the protective chuck can further comprise a pressure gauge coupled to the bottom surface to measure a gas pressure, or a restricting valve coupled to the second gas conduit to regulate a flow resistance of the second gas conduit.

In some embodiments, the present invention discloses a method for processing a substrate, comprising magnetically levitating a protective chuck above a surface region of a substrate; establishing a gas layer between a bottom surface of the protective chuck and the surface region of a substrate; and supplying a fluid on the remaining surface of the substrate. The method can further comprise sealing an edge of the substrate.

In some embodiments, the method further comprise lowering the protective chuck onto the substrate, wherein a bottom surface of the protective chuck levitates above a surface region of the substrate by magnetic repulsion; controlling a magnetic repulsion between the protective chuck and the surface region of the substrate to achieve a separation distance between the bottom surface of the protective chuck and the surface region of the substrate; adjusting a gas flow or a gas flow path conductance to achieve a gas pressure of the gas layer; measuring a gas pressure between the bottom of the protective chuck and the region surface; dynamically regulating the gas flow to achieve a gas pressure of the gas layer; cleaning the remaining surface of the substrate; wet etching the remaining surface of the substrate; submerging the substrate in a fluid tank with the surface region protected by the gas layer of the protective chuck; or regulating the gas layer to either generate gas bubbles flowing to the fluid outside the surface region or to generate fluid bubbles flowing toward the gas layer.

FIGS. 7A-7D illustrate exemplary protective chucks having embedded magnetic element configurations according to some embodiments of the present invention. A protective chuck is disposed above a substrate 730, which is supported by a substrate support. The substrate support and the protective chuck each comprises embedded magnetic elements, configured to create magnetic repulsion force, preferably a balanced repulsion force, to stably levitate the protective chuck above the substrate support. Mechanical elements, such as linear guides or gimbal joints, can be included to aid in stabilizing the protective chuck.

Figure 7A:
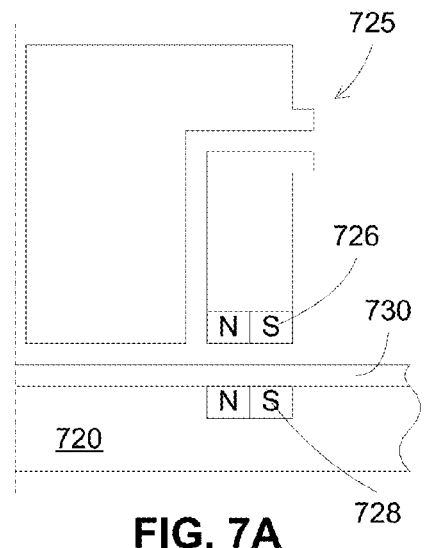
FIGS. 7A-7D illustrate exemplary protective chucks having embedded magnetic element configurations according to some embodiments of the present invention.

In FIG. 7A, magnets (electromagnets or permanent magnets) 726 and 728 are embedded in both protective chuck 725 and substrate support 720, respectively. The polarities of the magnets are configured to generate repulsion force between the two magnets, such as a north/south pole of magnet 726 is facing a north/south pole of magnet 728. The magnets are configured to have the north/south polarities arranged in parallel with the substrate surface. In some embodiments, permanent magnets can be used in the protective chuck and/or the substrate support. In some embodiments, electromagnets can be used, for example, in the substrate support 720, with embedded power source or with connection wirings coupled to an external power source.

Figure 7B:
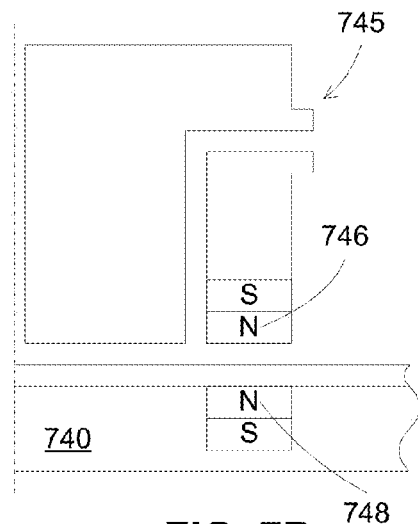

FIG. 7B shows another configuration of two magnets where the north/south polarities arranged perpendicular with the substrate surface. Magnets 746 and 748 are shown embedded in protective chuck 745 and in substrate support 740, respectively, with north pole of magnet 746 facing north pole of magnet 748.

Figure 7C:
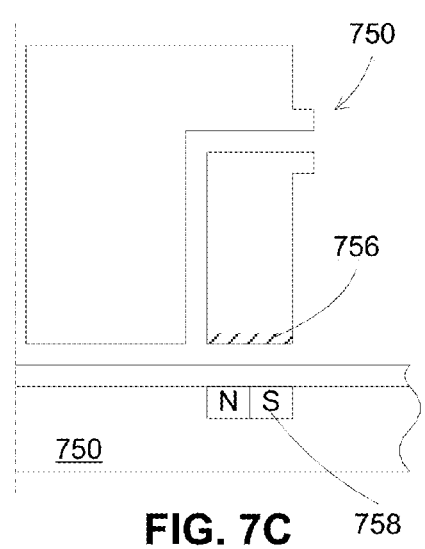
Figure 7D:
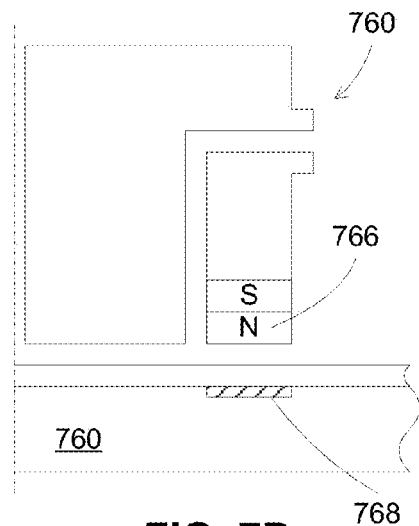

FIGS. 7C and 7D show magnet element configurations using diamagnetic materials, either using diamagnetic element 756 embedded in protective chuck 750 or by using diamagnetic element 768 embedded in substrate support 760. Corresponding magnets (permanent or electromagnetic) 758 and 766 are embedded in substrate support 750 and in protective chuck 760, respectively.

Figure 8A:
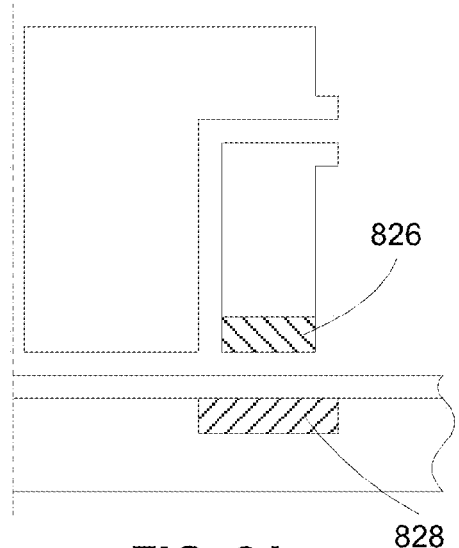
FIGS. 8A-8D illustrate other exemplary protective chucks having embedded magnetic element configurations according to some embodiments of the present invention.
Figure 8B:
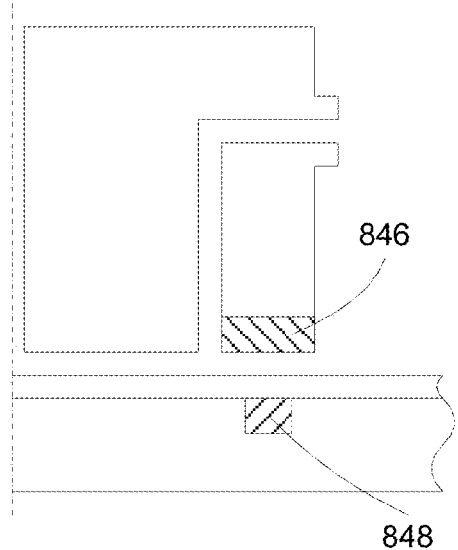

FIGS. 8A-8D illustrate other exemplary protective chucks having embedded magnetic element configurations according to some embodiments of the present invention. The magnetic elements can have different sizes in the protective chuck and in the substrate support. For example, magnetic element 828 in a substrate support can be wider than magnet element 826 in a protective chuck (FIG. 8A). Conversely, magnetic element 846 in a protective chuck can be wider than magnet element 848 in a substrate support (FIG. 8B).

Figure 8C:
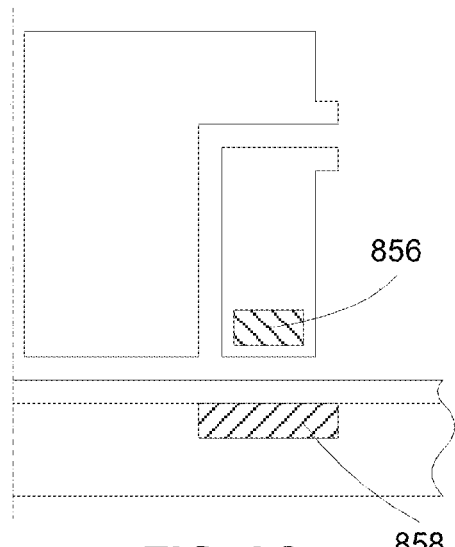
Figure 8D:
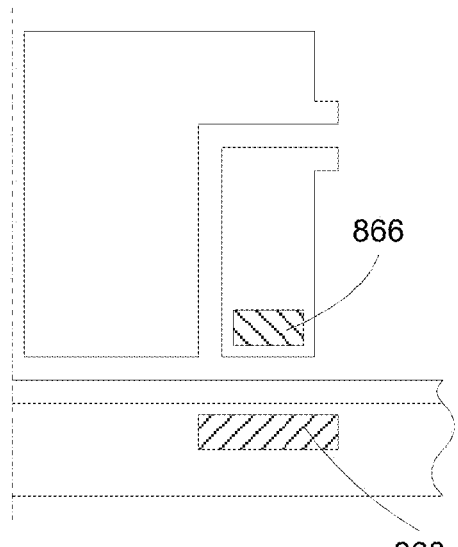

In some embodiments, the magnetic elements can be disposed close to an external surface, or can be embedded within the surface. For example, magnetic element 856 can be totally embedded within a protective chuck while magnetic element 858 is disposed on a surface of substrate support (FIG. 8C). Both magnetic elements can be embedded within the surface, such as magnetic element 866 is embedded within a protective chuck and magnetic element 868 is embedded within a substrate support (FIG. 8D).

Figure 9A:
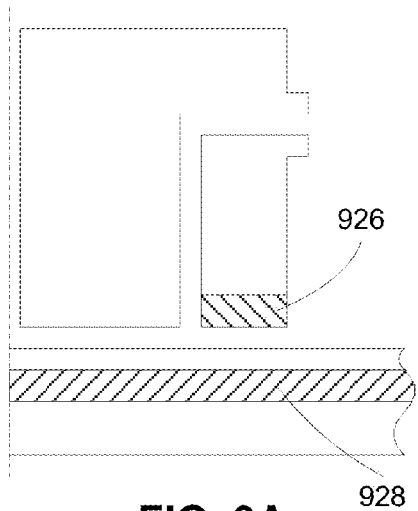
FIGS. 9A-9D illustrate other exemplary protective chucks having magnetic elements according to some embodiments of the present invention.
Figure 9B:
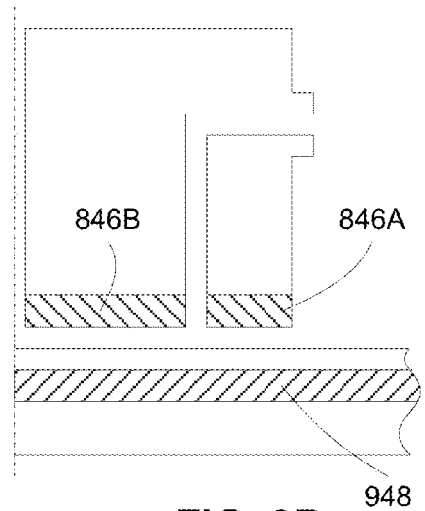
Figure 9C:
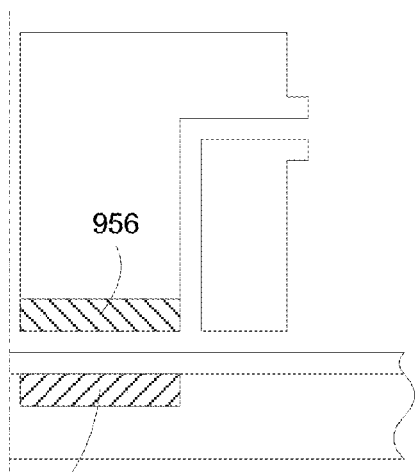
Figure 9D:
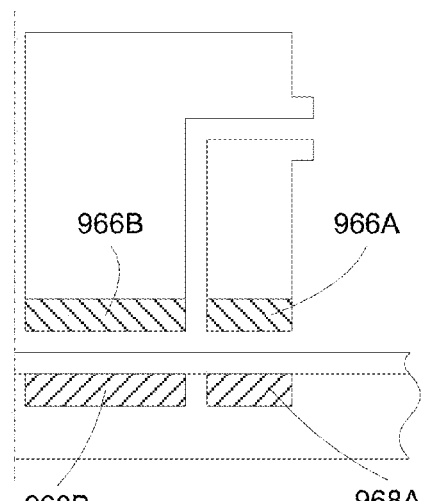

FIGS. 9A-9D illustrate other exemplary protective chucks having magnetic elements according to some embodiments of the present invention. The magnetic elements can be disposed on a small portion, a large portion, or on the entire surface of the protective chuck or the substrate support. For example, the magnetic element 926 can be disposed at an outer ring of a protective chuck while magnetic element 928 is disposed along the surface of the substrate support (FIG. 9A). The magnetic elements 946A and 946B can be disposed at an outer ring and at inner portion, respectively, of a protective chuck while magnetic element 948 is disposed along the surface of the substrate support (FIG. 9B). The magnetic element 956 can be disposed at an inner portion of a protective chuck while magnetic element 958 is disposed in a corresponding portion in the substrate support (FIG. 9C). The magnetic elements 966A and 966B can be disposed at an outer ring and at inner portion, respectively, of a protective chuck while magnetic elements 968A and 968B are disposed in corresponding portions in the substrate support (FIG. 9D).

Figure 10A:
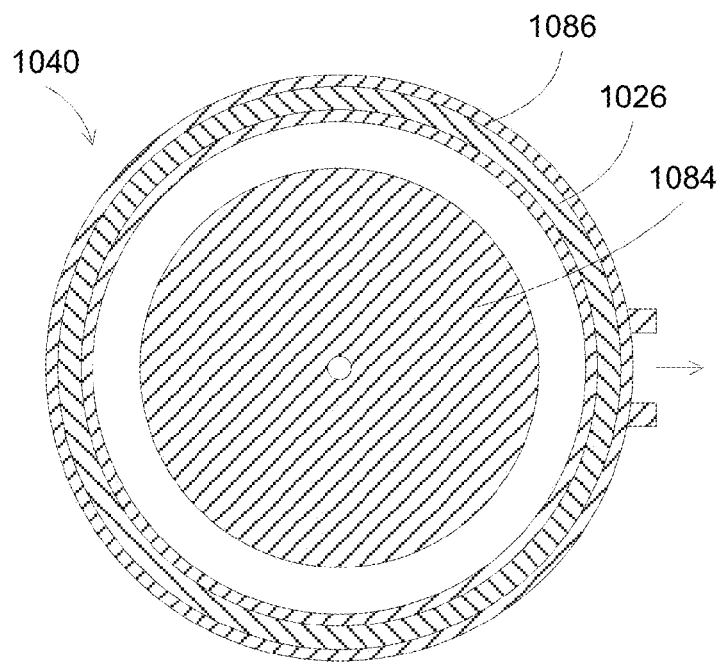
FIGS. 10A-10B illustrate cross sections of a bottom view of exemplary protective chucks according to some embodiments of the present invention.
Figure 10B:
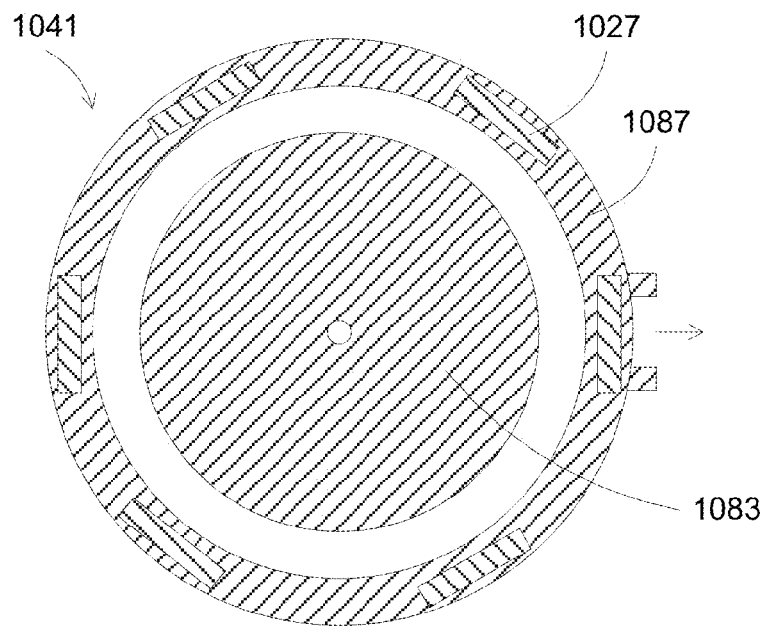

In some embodiments, the magnetic elements can be disposed along a peripheral of the protective chuck. FIGS. 10A-10B illustrate cross sections of a bottom view of exemplary protective chucks according to some embodiments of the present invention. In FIG. 10A, a protective chuck 1040 comprises a ring of magnetic element 1026 disposed along the outer flat ring 1086. Alternatively, or additionally, other magnetic elements can be embedded in the inner flat ring 1084 of the protective chuck. In FIG. 10B, a protective chuck 1041 comprises multiple magnetic elements 1027, disposed along the peripheral of the outer flat ring 1087. Alternatively, or additionally, other magnetic elements can be embedded in the inner flat ring 1083 of the protective chuck.

In some embodiments, the magnetic elements provide repulsion force to establish an air gap between the protective chuck and the substrate. A gas layer can be formed in the air gap, pressurizing the air gap repel fluid from the surrounding area. A gas flow can be supplied to the protective chuck, flowing across the bottom surface of the protective chuck, and exhausting from a vent ring.

Figure 11A:
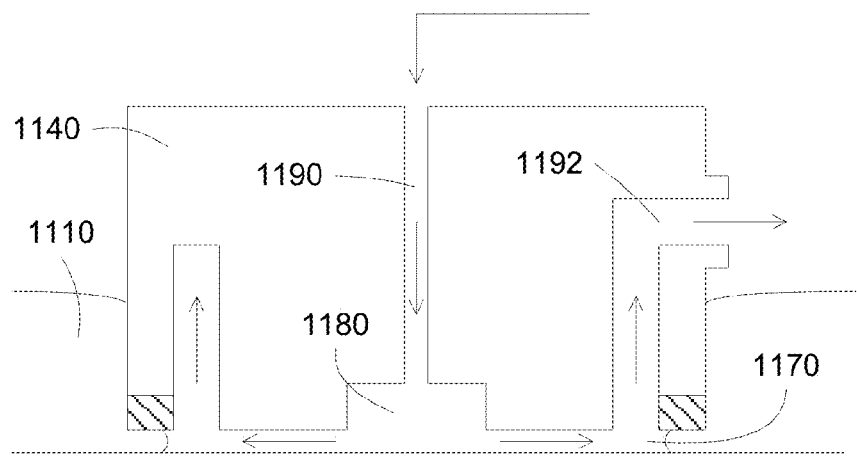
FIGS. 11A-11B illustrate exemplary protective chucks having gas flow configurations according to some embodiments of the present invention.
Figure 11B:
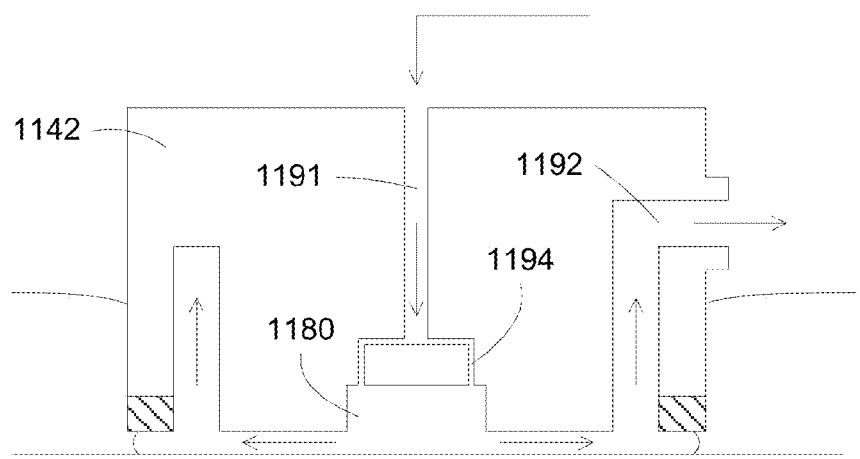

FIGS. 11A-11B illustrate exemplary protective chucks having gas flow configurations according to some embodiments of the present invention. In FIG. 11A, protective chuck 1140 comprises an inner flat area 1184 surrounding an inner recessed area 1180, which form a pocket of gas pressure within the inner recessed area 1180. The inner recessed area 1180 is coupled to the first conduit 1190 to provide an input gas for the gas layer. Second conduit 1192 provides an exhaust for the input gas after passing through the inner flat area 1184. With a same outer recessed ring 1182 and outer flat area 1186, the inner flat area 1184 is reduced with the enlarging of the inner recessed area 1180.

In some embodiments, the inlet of the first conduit 1191 at the outer surface of the protective chuck is coupled to a gas source to provide a gas flow to the gas layer 1170. The outlet of the first conduit 1191 can comprise a plurality of outlets 1194 distributed in a peripheral of the inner recessed area. The peripheral distribution of the plurality of outlets is preferably uniform, allowing an even distribution of gas flow along the inner flat area of the protective chuck. As shown in FIG. 11B, protective chuck 1142 comprises a plurality of smaller conduits 1194 coupled to first conduit 1191, and delivering inlet gas to the inner recessed area 1180 through a plurality of small holes 1195.

In some embodiments, the second conduit provides an exhaust for the gas flow. The inlet of the second conduit is preferably distributed along a peripheral of the inner flat area, comprising a ring inlet coupled to a peripheral area, e.g., the outer recessed area, between the inner and outer substantially flat areas for collecting gas flow along the inner flat area. The first and second conduits are preferably configured to provide a uniform flow at the gas layer, for example, generating a laminar flow with minimum turbulence.

Figure 12:
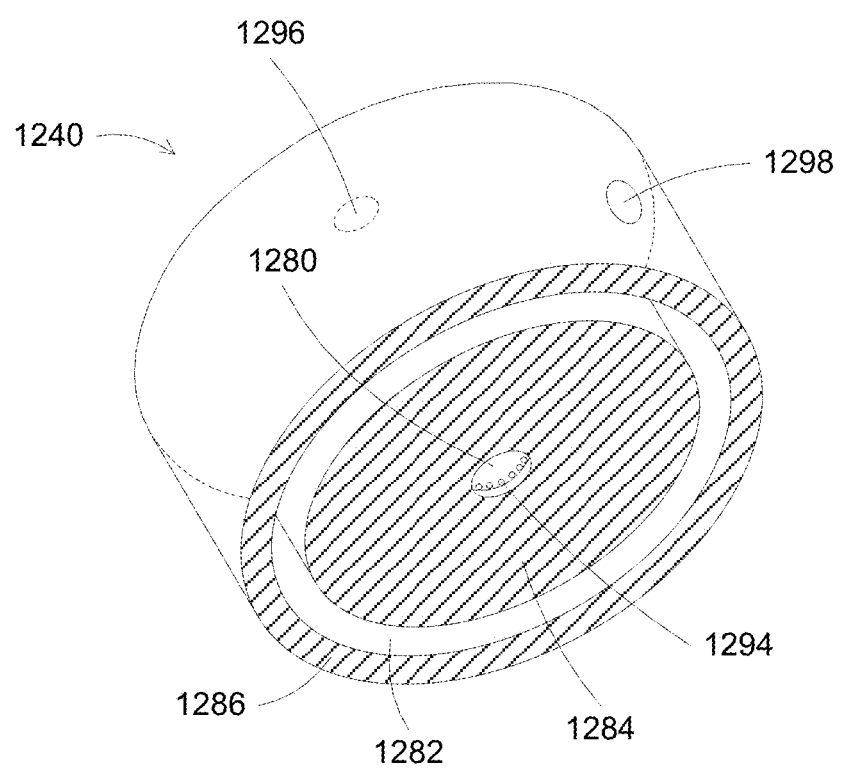
FIG. 12 illustrates a perspective view of an exemplary protective chuck according to some embodiments of the present invention.

FIG. 12 illustrates a perspective view of an exemplary protective chuck according to some embodiments of the present invention. Protective chuck 1240 comprises a bottom surface comprising an inner flat ring 1284 and an outer flat ring 1286, sandwiching an outer recessed ring 1282, which is fluidly coupled to outlet coupling 1298 at an outer surface. Outlet coupling 1298 is disposed at a side surface of the protective chuck 1240. An inner recessed area 1280 is disposed in the middle of the inner flat ring 1284, comprising plurality of small holes 1294 fluidly coupled to another outlet coupling 1296 at an outer surface. Outlet coupling 1296 is disposed at a top surface of the protective chuck 1240. A first conduit (not shown in this figure, but similar to first conduit 1191 shown in FIG. 11B) couples the outlet coupling 1296 with the inner recessed area 1280. A second conduit (not shown in this figure, but similar to second conduit 1192 shown in FIG. 11B) couples the outer recessed ring 1282 with the outlet coupling 1298. A gas supply can be coupled to outlet coupling 1296 to create a gas flow along the first conduit to the inner recessed area 1280, which then flows across the inner flat ring 1284 and exhausts to the outer recessed ring 1282 and, through the second conduit, to the outlet coupling 1298.

Figure 13A:
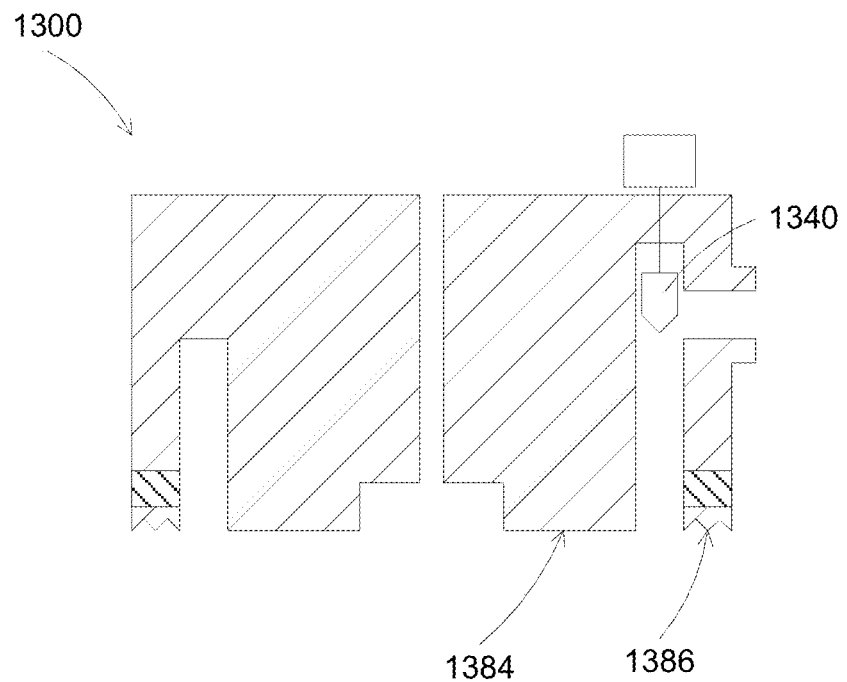
FIGS. 13A-13B illustrate exemplary protective chuck configurations according to some embodiments of the present invention.
Figure 13B:
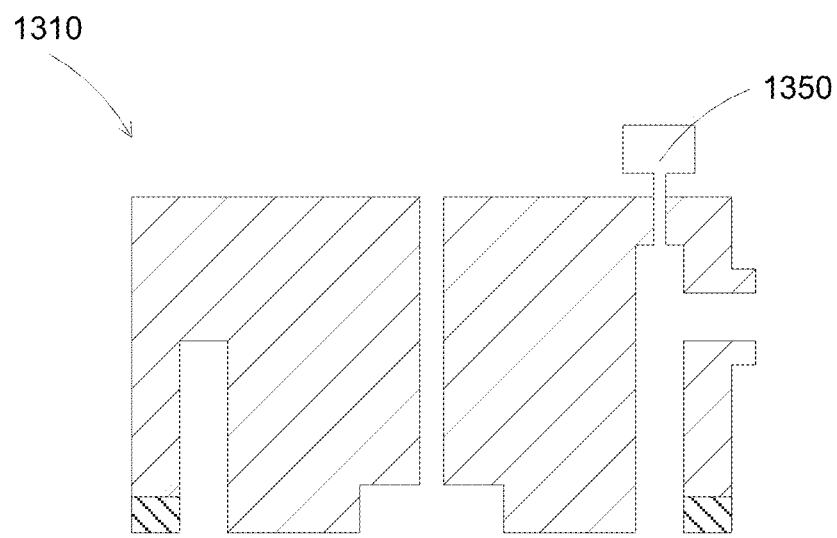

FIGS. 13A-13B illustrate exemplary protective chuck configurations according to some embodiments of the present invention. The protective chuck can comprise integrated flow restrictor, rough surface and pressure gauge coupling to enhance functionality and flexibility.

In some embodiments, the protective chuck can comprise a flow restricting mechanism at the exhaust, for example, to regulate the flow conductance, and consequently the pressure at the gas layer. FIG. 13A shows a protective chuck 1300 having a valve 1340 coupled to outlet conduit 1392 to restrict an exhaust flow of the gas layer. The valve 1340 can be a manual valve, which is manually adjusted to achieve a desired gas layer. The valve 1340 can be an automatic valve, which can be adjusted by a controller, for example, in response to a pressure reading, to dynamically regulate a desired gas layer.

In some embodiments, the surface 1386 of the outer flat area is configured to be rougher than the surface 1384 of the inner flat area of the protective chuck 1300. The roughness is preferably microscopic, for example, on the order of micron roughness. A flat inner surface 1384 is preferred to achieve an effective gas layer. A flat, but microscopically rougher than the inner flat surface 1384, outer surface 1386 can be used to create higher resistance to the fluid flow toward the protected region under the protective chuck.

In some embodiments, a pressure gauge is provided to measure the gas pressure of the gas layer. The pressure gauge can be coupled to the bottom surface, such as at the inner or outer recessed areas. In some embodiments, a dead area can be provided for pressure measurement, avoiding measuring directly at a gas flow path. FIG. 13B shows a protective chuck 1310 having a recessed area 1350 coupled to a pressure gauge 1355 to measure the gas pressure at the exhaust flow 1392. Other locations within the gas flow can be used.

In some embodiments, the present invention discloses methods for processing a substrate, using a magnetically levitated protective chuck configured for forming a gas layer at a bottom surface of the protective chuck. After supplying a gas flow to the protective chuck to create a gas flow along the bottom surface, the protective chuck is lowered onto a substrate. Under appropriate conditions, such as proper gas flow and air gap between the bottom surface of the protective chuck and the substrate surface, the gas flow can cause the protective chuck to be levitated above the substrate surface, forming a surface region on the substrate that is protected by the gas layer against a fluid disposed on the substrate surface outside the surface region.

In some embodiments, the gas flow to the protective chuck exits at a first location on the bottom surface, releasing to the air ambient. The first location can be disposed at a middle area of the bottom surface, and preferably configured to be distributed along a peripheral of a center area for uniform flowing across the bottom surface area. Upon approaching the substrate surface, the gas flow runs along the gap between the bottom surface of the protective chuck and the substrate surface. Upon encountered and blocked by the outside fluid, the gas flow escapes through a second location on the bottom surface. The second location can be disposed at a peripheral of the bottom surface, and preferably surrounding the bottom surface, leaving a small bottom surface ring around the outer edge of the protective chuck.

In some embodiments, the protective chuck protects the surface region from the fluid without contacting the surface region. The gas pressure of the gas layer can be configured to balance the fluid flow, forcing the fluid to stay outside the surface region protected by the protective chuck. The boundary between the gas layer and the outside fluid can be at the outer edge of the protective chuck, or can be somewhat inside the edge, depending on the gas pressure. At high pressure, the gas can exert a strong force against the fluid, with some gas entering the fluid, forming bubbles at the area surrounding and outside the protective chuck. At low pressure, the fluid pushes into the protected area, with some fluid mixing with the gas at the gas exhaust location, forming bubbles at the area surrounding and inside the protective chuck.

In some embodiments, the flow of the gas to the bottom surface of the protective chuck and/or the resistance or conductance of the gas flow path is controlled to achieve a desired gas pressure, and effectively a desired boundary region between the fluid outside the surface region and the gas within the surface region. A desired gas flow can be used, establishing a gas pressure that forms a fluid-gas boundary at the outer edge of the protective chuck, without any bubbles inside or outside of the protected area. In some embodiments, the gas pressure of the gas layer is measured, and used to regulate the gas flow to dynamically achieve a desired gas pressure.

Figure 14A:
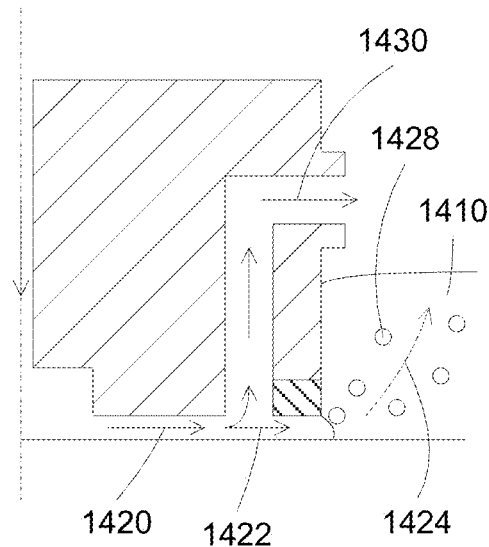
FIGS. 14A-14C illustrate different exemplary modes of operation for a gas layer according to some embodiments of the present invention.
Figure 14B:
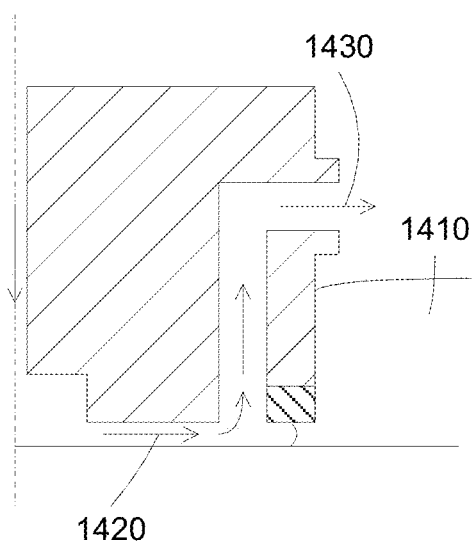
Figure 14C:
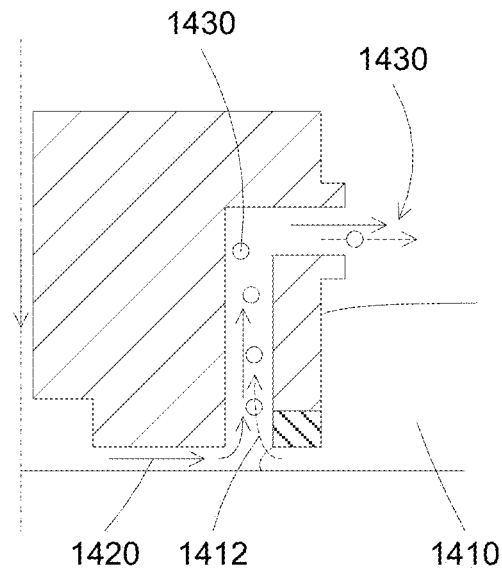

FIGS. 14A-14C illustrate different exemplary modes of operation for a gas layer according to some embodiments of the present invention. In general, if the gas pressure within the gas layer is too high, excess gas can escape to the surrounding fluid, creating bubbles toward the fluid surrounding the protective chuck. The high pressure can be established by a high gas flow, a low flow conductive exhaust, or a protective chuck configuration favoring high pressure gas layer. Conversely, if the gas pressure is too low, outside fluid can enter the gas stream, creating aerated gas flow having fluid bubbles.

FIG. 14A shows a schematic behavior of a protective chuck with high gas layer pressure, for example, created by high gas flow 1420 across the inner flat bottom surface of the protective chuck 1400. A portion 1430 of the gas flow 1420 follows the exhaust. A portion 1422 of the flow 1420 can escape through the fluid 2110, generating a flow 1424 of gas bubbles 1428 at the area surrounding the protective chuck side surface.

FIG. 14C shows a schematic behavior of a protective chuck with low gas layer pressure, for example, created by low gas flow 1420 across the inner flat bottom surface of the protective chuck 1400. With the low pressure, the fluid can enter the exhaust flow stream 1430, generating a flow 1412 of fluid bubbles 1418 within the exhaust flow 1430, creating an aerated flow 1430.

FIG. 14B shows a schematic behavior of the protective chuck with balance gas layer pressure. Both the fluid and gas are blocked at the gas layer interface, forming a protected region under the protective chuck without bubble formation. The gas-fluid boundary 1470 can be varied across the outer flat area, offering a process window for the balanced gas layer pressure.

In some embodiments, different behaviors of the protective chuck can be controlled by adjusting the gas flow or the exhaust conductance. The adjustment can be performed manually or automatically. For example, the gas flow or the gas conductance can be dynamically controlled according to a pressure measurement of the gas layer.

Figure 15A:
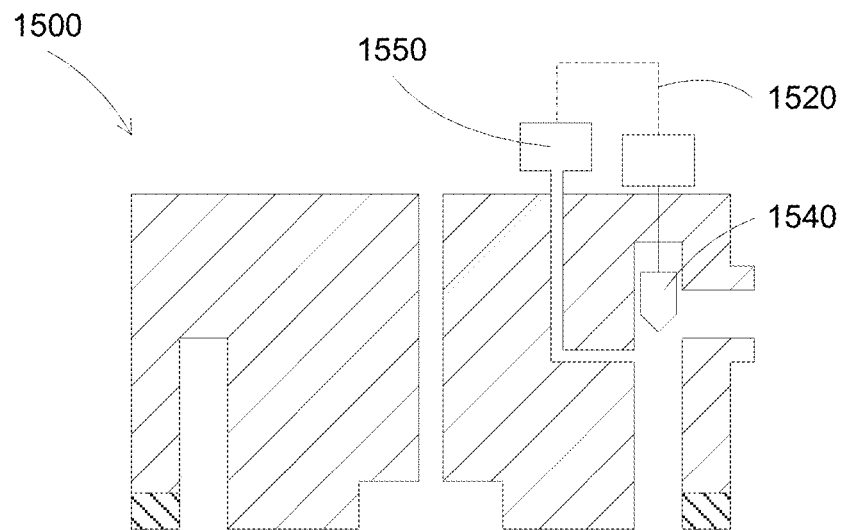
FIGS. 15A-15B illustrate exemplary dynamic controlling of a protective chuck according to some embodiments of the present invention.
Figure 15B:
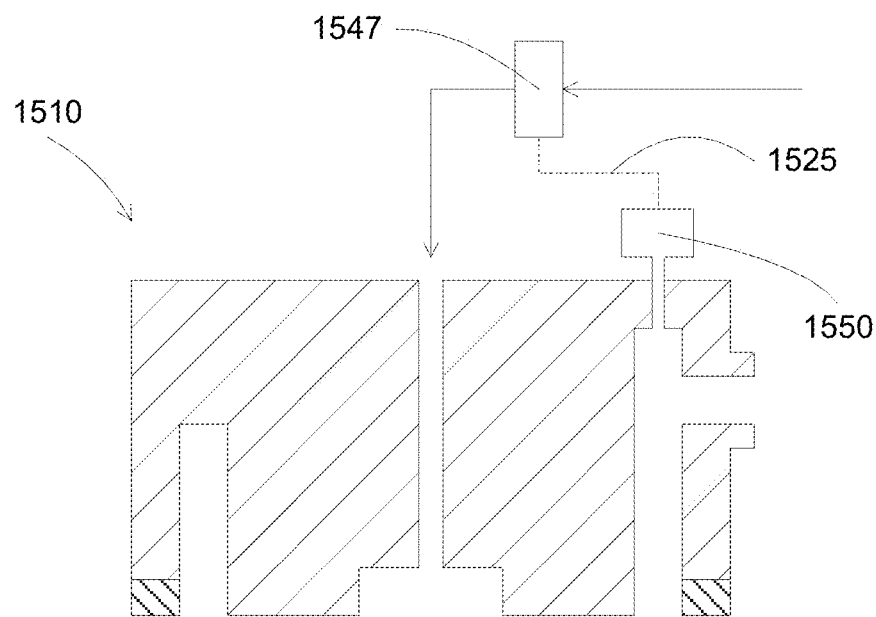

FIGS. 15A-15B illustrate exemplary dynamic controlling of a protective chuck according to some embodiments of the present invention. In FIG. 15A, a protective chuck 1500 comprising a flow conductance valve 1540 and a pressure gauge 1550 are coupled, for example, by an electrical signal path 1520. The conductance of the exhaust flow can be dynamically adjusted based on a pressure reading of the pressure gauge 1550. An optional controller can be included to control the flow valve 1540.

In FIG. 15B, a protective chuck 1500 comprising a pressure gauge 1550, which is coupled to a flow controller 1547, for example, by an electrical signal path 1525. The gas flow to the protective chuck can be dynamically adjusted based on a pressure reading of the pressure gauge 1550. An optional controller can be included to control the flow controller 1547 based on the pressure reading.

In some embodiments, the magnetic repulsion force between the protective chuck and the substrate support can be adjusted to achieve a desired air gap. The adjustment can be performed manually or automatically. For example, the electromagnets disposed in the substrate support can be dynamically controlled, e.g., regulating a current flowing through the coils of the electromagnets, according to a pressure measurement of the gas layer.

In some embodiments, the protective chuck is mounted on a support, which can be raised or lowered to the substrate surface. Different mounting mechanisms can be used, such as a gimbal mounting, which can stabilize the protective chuck with respect to the substrate surface, or a linear guide mounting, which can guide the protective chuck in the motions toward or from the substrate.

Figure 16A:
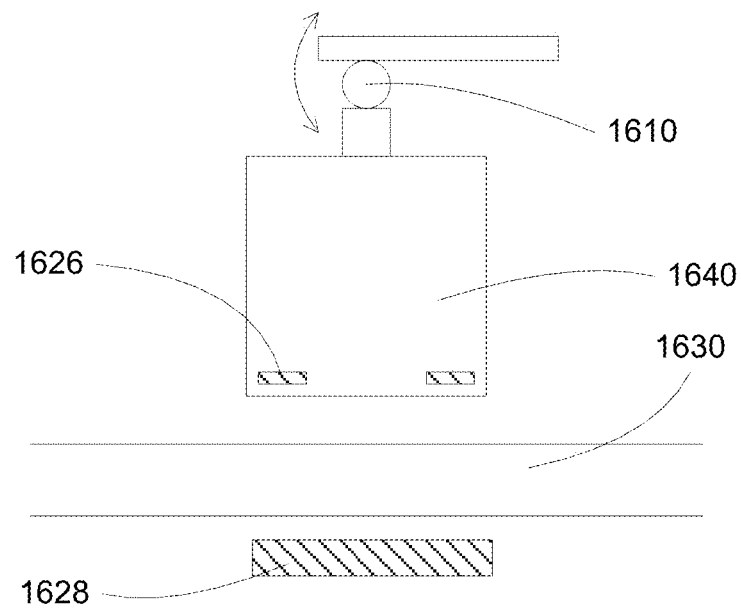
FIGS. 16A-16B illustrate exemplary mounting mechanisms for a protective chuck according to some embodiments of the present invention.
Figure 16B:
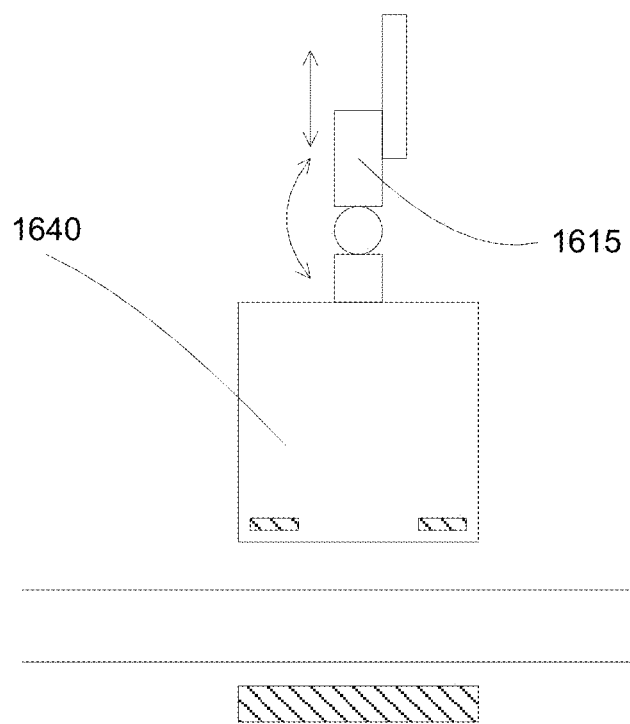

FIGS. 16A-16B illustrate exemplary mounting mechanisms for a protective chuck according to some embodiments of the present invention. In FIG. 16A, a protective chuck 1640 is levitated above a substrate 1630 due to the repulsive forces of magnetic elements 1626 and 1628, embedded within the protective chuck and a substrate support, respectively. A gimbal mounting 1610 is coupled to the protective chuck 1640, allowing the protective chuck to rotate, based on gravity force, to be aligned with the substrate 1630.

In FIG. 16B, the protective chuck 1640 is further coupled to a linear guide 1615, allowing the protective chuck to move in a perpendicular direction with respect to the substrate surface, for example, to adjust the air gap between the protective chuck and the substrate.

In some embodiments, the present invention discloses systems and methods for processing a substrate, by using magnetic repulsion to levitating the protective chuck, in addition to supplying a gas flow to a protective chuck to form a gas layer, pressurizing the gap between the protective chuck and the substrate surface. The gas pressure of the gas layer prevents the fluid from entering the protected region.

Figure 17A:
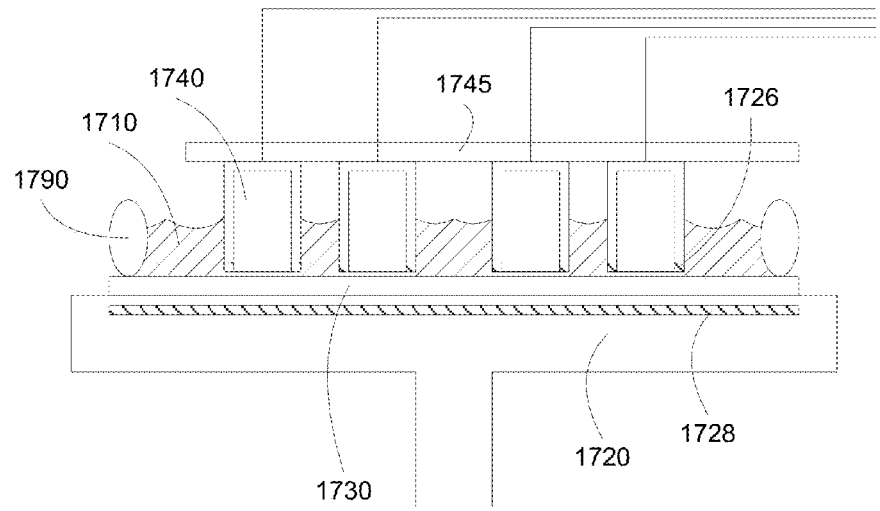
FIGS. 17A-17B illustrate exemplary high productivity combinatorial systems, which employs magnetic levitating protective chucks according to some embodiments of the present invention.
Figure 17B:
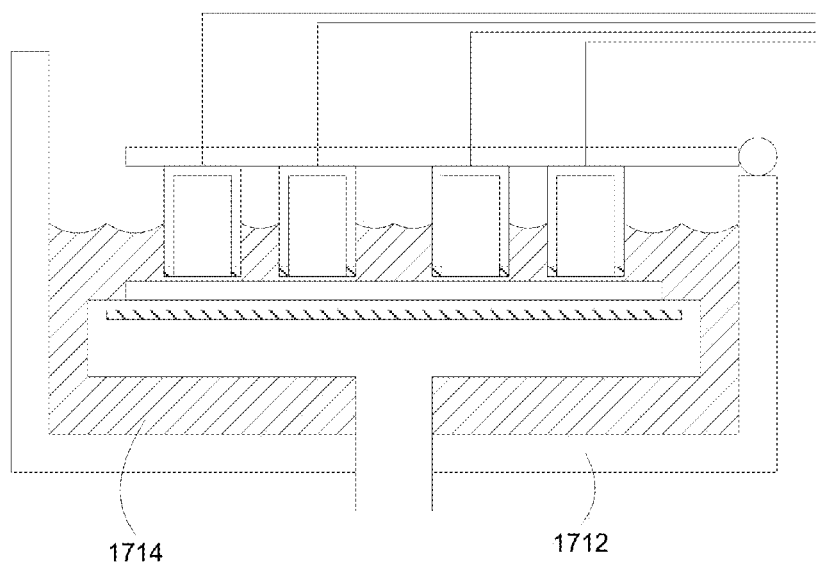

FIGS. 17A-17B illustrate exemplary high productivity combinatorial systems, which employs magnetic levitating protective chucks according to some embodiments of the present invention. In FIG. 17A, a chamber, for example, a processing chamber within a high productivity combinatorial system, comprises a substrate support 1720 having embedded magnetic element 1728. A substrate 1730 can be brought to the process chamber, and disposed on the substrate support 1720. A plurality of reactors 1740, for example, from a reactor assembly 1745, is lowered to the substrate surface. Magnetic repulsion forces between the magnetic elements 1728 in the substrate support 1720 and the magnetic elements 1726 in the reactors 1740 create an air gap between the bottom surface of the reactors 1740 and the substrate surface. Gas flow to the reactors 1740 can pressurize the air gap, forming a gas layer under the reactors 1740. Processing fluid 1710, such as rinsing water to cleaning solution, can be introduced to the substrate surface, outside the regions defined by gas layer under the reactors 1740. The substrate can be sealed at the edge, for example, by an o-ring 1790, to contain the fluid within the substrate surface. The gas layer under the reactors 1740 is pressurized, preventing the fluid from entering the regions of the gas layer. The processing of the fluid is then restricted to the substrate surface outside the reactor areas, with the magnetically levitated reactors protecting the surface areas under the reactors.

FIG. 17B shows another processing chamber, comprising a tank 1712 having processing fluid 1714. The substrate, the substrate support, and a portion of the reactors are submerged in the tank 1712. The gas layer under the reactors is pressurized, preventing the fluid from entering the regions of the gas layer. The processing of the fluid is then restricted to the substrate surface outside the reactor areas, with the magnetically levitated reactors protecting the surface areas under the reactors.

In some embodiments, the present invention discloses a combinatorial processing system comprising a protective chuck and a substrate support. The protective chuck can comprise first and second gas conduits to provide a gas flow across a bottom surface of the protective chuck, and a first magnetic material disposed in a vicinity of the bottom surface. The substrate support can comprise a second magnetic material, wherein the first and second magnetic materials are configured to generate magnetic repulsion to levitate the protective chuck above the substrate support.

The combinatorial processing system can further comprise a gas flow controller coupled to the first gas conduit to regulate the gas flow, a pressure gauge coupled to either the first or second gas conduit to measure a gas pressure, a gas flow controller coupled to the first gas conduit to regulate the gas flow, a pressure gauge coupled to either the first or second gas conduit to measure a gas pressure, or a controller to regulate the gas flow utilizing inputs from the pressure gauge. In some embodiments, the first or second magnetic material comprises a magnet or a diamagnetic material.

Figure 18:
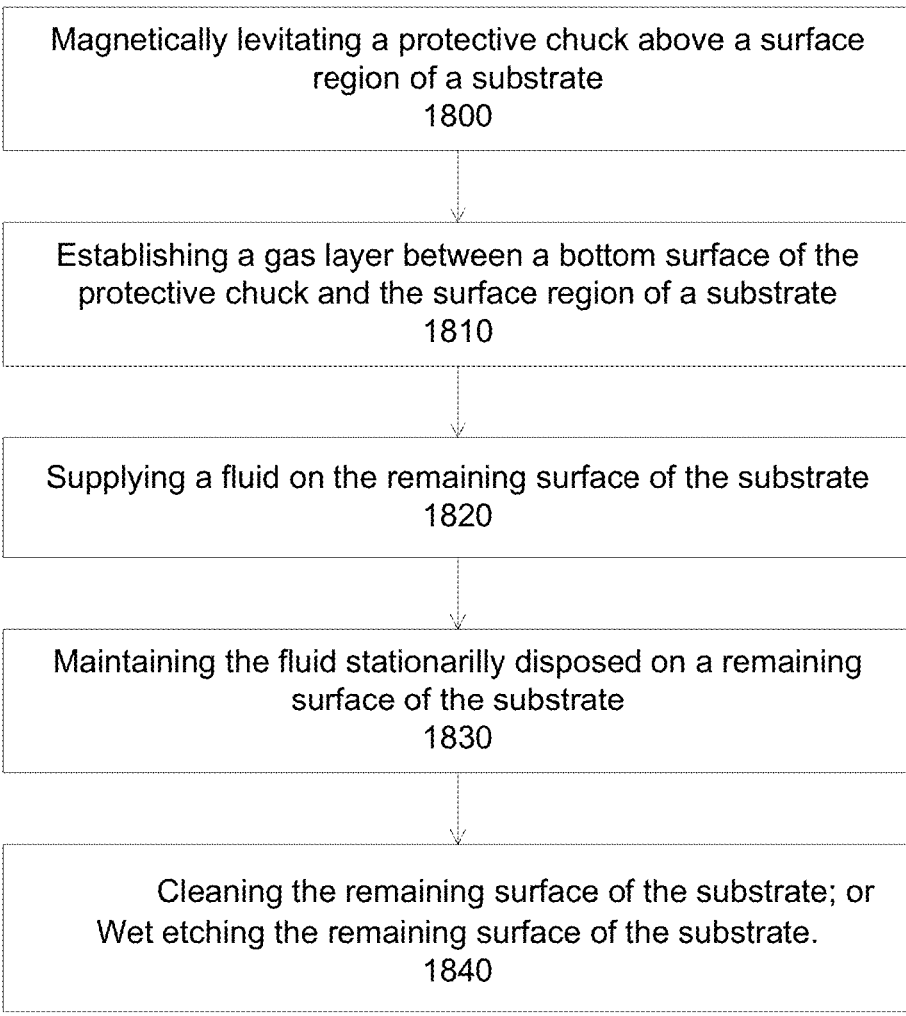
FIG. 18 illustrates an exemplary flowchart for processing a substrate using a magnetically levitated protective chuck according to some embodiments of the present invention.

In some embodiments, the present invention discloses methods for processing a substrate, using a magnetically levitated protective chuck configured for forming a gas layer at a bottom surface of the protective chuck. FIG. 18 illustrates an exemplary flowchart for processing a substrate using a magnetically levitated protective chuck according to some embodiments of the present invention. Operation 1800 magnetically levitates a protective chuck above a surface region of a substrate. Operation 1810 establishes a gas layer between a bottom surface of the protective chuck and the surface region of a substrate. Operation 1820 supplies a fluid on the remaining surface of the substrate. Operation 1830 maintains the fluid stationarilly disposed on a remaining surface of the substrate. Operation 1840 cleans the remaining surface of the substrate or wet etching the remaining surface of the substrate.

FIG. 19 illustrates another exemplary flowchart for processing a substrate using a magnetically levitated protective chuck according to some embodiments of the present invention. Operation 1900 lowers the protective chuck onto the substrate, wherein a bottom surface of the protective chuck levitates above a surface region of the substrate by magnetic repulsion. The protective chuck can be lowered onto a substrate so that the bottom surface of the protective chuck is disposed in proximity to a surface region of the substrate, wherein a magnetic repulsion force between the protective chuck and a substrate support causes the protective chuck to be levitated above the substrate surface. A gas flow can be introduced at the bottom surface protects the surface region from a fluid disposed on the substrate outside the surface region. The gas flow can be supplied to an interior of a protective chuck, wherein the gas exits the protective chuck at a first location of a bottom surface, and a portion of the gas flow returns to the protective chuck at a second location of the bottom surface. Operation 1910 controls a magnetic repulsion between the protective chuck and the surface region of the substrate to achieve a separation distance between the bottom surface of the protective chuck and the surface region of the substrate.

Operation 1920 submerges the substrate in a fluid tank with the surface region protected by the gas layer of the protective chuck. Alternatively, a fluid can be supplied to the substrate surface, flooding the substrate surface for wet processing. The fluid can perform cleaning of the substrate surface, or can perform wet etching of a top layer on the substrate surface. With one or more protective chucks protecting one or more surface regions, selective wet processing using the supplied fluid can be performed, processing the substrate surface located outside the surface areas protected by the protective chucks. Alternatively, a fluid can be supplied to the substrate surface, flooding the substrate surface for wet processing. The fluid can perform cleaning of the substrate surface, or can perform wet etching of a top layer on the substrate surface. With one or more protective chucks protecting one or more surface regions, selective wet processing using the supplied fluid can be performed, processing the substrate surface located outside the surface areas protected by the protective chucks.

Operation 1930 adjusts the gas flow or the gas flow path conductance to achieve a gas pressure of the gas layer. For example, the gas flow can be controlled to achieve a desired boundary region between the fluid outside the surface region and the gas within the surface region. In some embodiments, the flow of the gas to the bottom surface of the protective chuck and/or the resistance or conductance of the gas flow path is controlled to achieve a desired gas pressure, and effectively a desired boundary region between the fluid outside the surface region and the gas within the surface region. Alternatively or additionally, a conductance of the gas flow path is controlled to control a gas pressure between the bottom of the protective chuck and the region surface. In some embodiments, the gas flow or the gas conductance is dynamically controlled according to a pressure measurement of the gas layer to achieve a desired pressure of the gas layer. Operation 1940 measures a gas pressure between the bottom of the protective chuck and the region surface, and dynamically regulates the gas flow to achieve a gas pressure of the gas layer. Operation 1950 regulates the gas layer to either generate gas bubbles flowing to the fluid outside the surface region or to generate fluid bubbles flowing toward the gas layer.

In some embodiments, the present invention discloses methods for processing a substrate, by establishing a gas layer under a protective chuck to form a non-contact exclusion surface region, free from a fluid processing at other surface areas of the substrate. The present selective processing methods can be used in high productivity combinatorial processes, achieving multiple isolated regions with different properties, which can be used for evaluating and optimizing materials and fabrication process conditions. For example, a large matrix screening can be performed through multiple isolated regions on a single wafer, providing a quick and cost effective way for new device and material developments.

In some embodiments, the present invention discloses methods to process multiple isolated regions on a single substrate, comprising protecting one or more surface regions while wet processing the rest of the substrate surface without contacting the surface. For example, a gas layer can be established between a bottom surface of a protective chuck and a surface region of a substrate. A fluid is then supplied on the remaining surface of the substrate for processing the remaining surface of the substrate. The gas layer protects the surface region, establishing a gas-fluid boundary at the edge of the protective chuck, preventing the surface region under the protective chuck to be processed by the fluid. The surface region is protected by the gas layer, levitating the protective chuck about the substrate surface without contacting the substrate.

Figure 20:
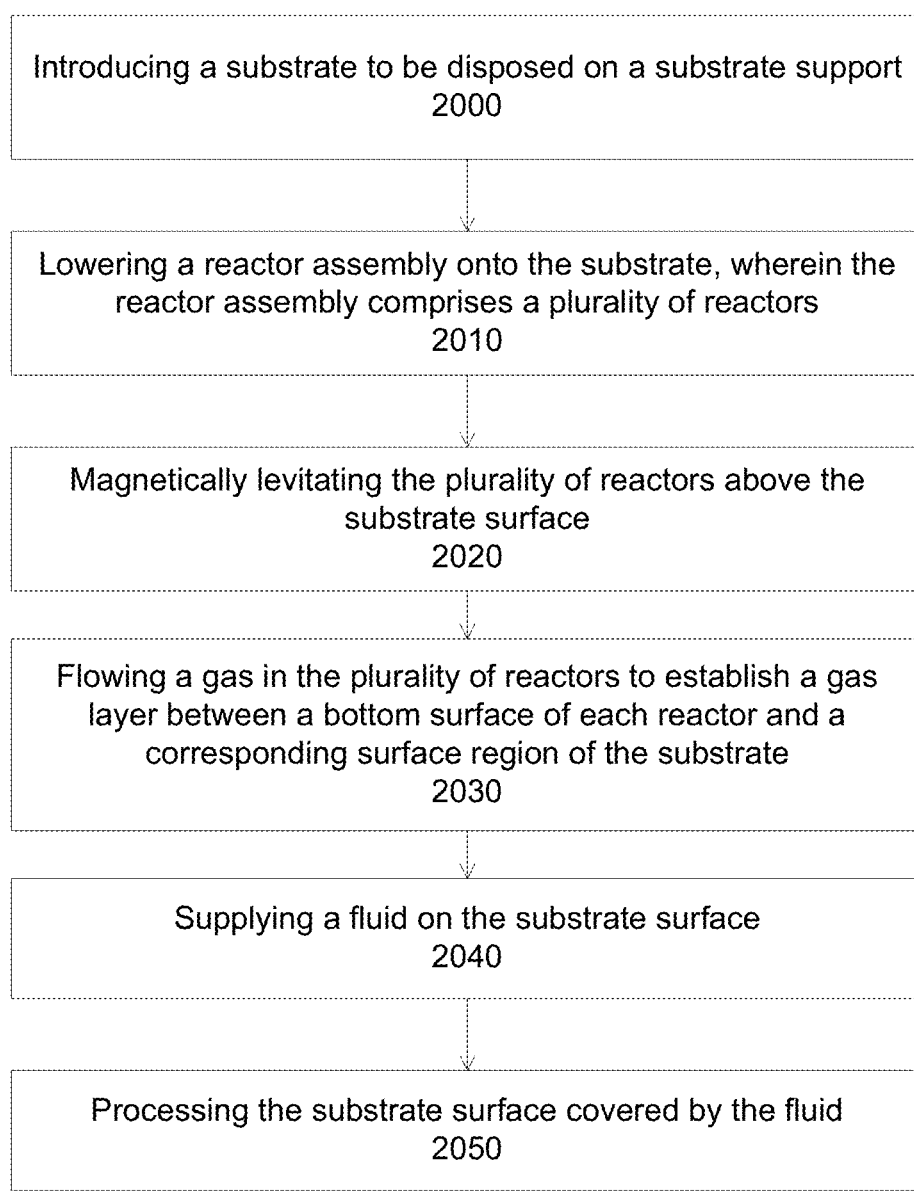
FIG. 20 illustrates an exemplary flowchart for processing a substrate in a high productivity combinatorial system according to some embodiments of the present invention.

FIG. 20 illustrates an exemplary flowchart for processing a substrate in a high productivity combinatorial system according to some embodiments of the present invention. Operation 2000 introduces a substrate to be disposed on a substrate support. Operation 2010 lowers a reactor assembly onto the substrate, wherein the reactor assembly comprises a plurality of reactors. Operation 2020 magnetically levitates the plurality of reactors above the substrate surface. Operation 2030 flows a gas in the plurality of reactors to establish a gas layer between a bottom surface of each reactor and a corresponding surface region of the substrate. Operation 2040 supplies a fluid on the substrate surface. Operation 2050 processes the substrate surface covered by the fluid.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for processing a substrate, the method comprising
positioning a chuck above a first surface region of a substrate, wherein the chuck is levitated using a magnetic force;

forming a layer of gas between a bottom surface of the chuck and the first surface region of the substrate; and applying a fluid on a second region of the substrate, wherein the second region is different from the first surface region.

2. The method as in claim 1 further comprising
sealing an edge of the substrate.

3. The method as in claim 1 further comprising
lowering the chuck onto the first surface region of the substrate.

4. The method as in claim 1 further comprising
controlling a magnitude of the magnetic force between the chuck and the first surface region of the substrate to achieve a separation distance between the bottom surface of the chuck and the first surface region of the substrate.

5. The method as in claim 1 further comprising
adjusting a gas flow or a gas flow path conductance to achieve a gas pressure of the layer of gas.

6. The method as in claim 1 further comprising:
measuring a gas pressure between the bottom of the chuck and the first surface region; and
dynamically regulating the gas flow to achieve a gas pressure of the layer of gas.

7. The method as in claim 1 further comprising at least one of
cleaning the second region of the substrate; or
wet etching the second region of the substrate.

8. The method as in claim 1 further comprising
submerging the substrate in a fluid tank with the first surface region protected by the layer of gas between the chuck and the first surface region.

9. The method as in claim 1 further comprising
regulating the layer of gas to either generate gas bubbles flowing to the fluid outside the first surface region or to generate fluid bubbles flowing toward the gas layer.

10. A chuck comprising
a bottom surface;
a first gas conduit terminating at the bottom surface;
a second gas conduit terminating at the bottom surface; and
a magnetic material disposed in the chuck,
wherein the magnetic material is configured to levitate the chuck above a surface region of the substrate by magnetic repulsion.

11. The chuck of claim 10 wherein the magnetic material comprises a magnet or a diamagnetic material.

12. The chuck of claim 10 wherein the first gas conduit comprises a plurality of gas outlets disposed in a periphery of a recessed area of the bottom surface of the chuck.

13. The chuck of claim 10 wherein the second conduit comprises a recessed ring surrounding a periphery of the bottom surface of the chuck.

14. The chuck of claim 10 further comprising
a pressure gauge coupled to the bottom surface of the chuck to measure a gas pressure.

15. The chuck of claim 10 further comprising
a restricting valve coupled to the second gas conduit to regulate a flow resistance of the second gas conduit.

16. A combinatorial processing system comprising
a chuck comprising a first gas conduit and second gas conduit, wherein each of the gas conduits is operable to provide a gas flow across a bottom surface of the chuck;
a first magnetic material disposed in the chuck; and
a substrate support comprising a second magnetic material, wherein the first and second magnetic materials are configured to generate magnetic repulsion to levitate the chuck above the substrate support.

17. The combinatorial processing system of claim 16 wherein the first or second magnetic material comprises a magnet or a diamagnetic material.

18. The combinatorial processing system of claim 16 further comprising
a gas flow controller coupled to the first gas conduit to regulate the gas flow.

19. The combinatorial processing system of claim 16 further comprising
a pressure gauge coupled to either the first gas conduit or second gas conduit to measure a gas pressure.

20. The combinatorial processing system of claim 16 further comprising
a gas flow controller coupled to the first gas conduit to regulate the gas flow;
a pressure gauge coupled to either the first gas conduit or second gas conduit to measure a gas pressure; and
a controller to regulate the gas flow utilizing inputs from the pressure gauge.

* * * * *